US008306591B2

(12) United States Patent
Lee et al.

(10) Patent No.: US 8,306,591 B2
(45) Date of Patent: Nov. 6, 2012

(54) TERMINAL STRUCTURE OF SUPERCONDUCTING CABLE SYSTEM

(75) Inventors: Seok Ju Lee, Masan-si (KR); Su Kil Lee, Gumi-si (KR); Hyun Man Jang, Hwaseong-si (KR); Chang Youl Choi, Gumi-si (KR)

(73) Assignee: LS Cable Ltd., Anyang-si, Gyeonggi-do (KR)

( * ) Notice: Subject to any disclaimer, the term of this patent is extended or adjusted under 35 U.S.C. 154(b) by 0 days.

(21) Appl. No.: 13/235,969

(22) Filed: Sep. 19, 2011

(65) Prior Publication Data

US 2012/0245033 A1 Sep. 27, 2012

(30) Foreign Application Priority Data

Mar. 22, 2011 (KR) ........................ 10-2011-0025259

(51) Int. Cl.
*H01L 39/24* (2006.01)

(52) U.S. Cl. ........................................ 505/230; 505/190

(58) Field of Classification Search .................. 505/190, 505/230–239
See application file for complete search history.

(56) References Cited

U.S. PATENT DOCUMENTS

| | | | | |
|---|---|---|---|---|
| 2005/0061537 | A1* | 3/2005 | Yumura et al. | 174/125.1 |
| 2008/0110659 | A1* | 5/2008 | Ashibe | 174/15.5 |
| 2011/0045987 | A1* | 2/2011 | Jang et al. | 505/163 |
| 2011/0174535 | A1* | 7/2011 | Sung et al. | 174/84 R |
| 2012/0108435 | A1* | 5/2012 | Ichiki et al. | 505/230 |
| 2012/0118600 | A1* | 5/2012 | Choi et al. | 174/15.5 |

* cited by examiner

*Primary Examiner* — Colleen Dunn

(74) *Attorney, Agent, or Firm* — Lowe Hauptman Ham & Berner, LLP

(57) ABSTRACT

A superconducting cable terminal connection device connecting a terminal of a superconducting cable for power transmission to an external power system, includes: an electric field relaxation shield disposed inside an insulation housing; a horizontal conductor fixed to an end portion of a core of the superconducting cable drawn into the electric field relaxation shield; an insulator which coats an outer periphery of the horizontal conductor; a vertical conductor which is drawn into the electric field relaxation shield and has a through-hole through which the horizontal conductor and the insulator pass so as to be slidable in a lengthwise direction; and a flexible electrical conduction member which electrically connects an end portion of the horizontal conductor to the vertical conductor.

8 Claims, 3 Drawing Sheets

TERMINAL STRUCTURE OF SUPERCONDUCTING CABLE SYSTEM

CROSS-REFERENCE TO RELATED APPLICATION

This application claims priority to Korean Patent Application No. 10-2011-0025259, filed on Mar. 22, 2011, and all the benefits accruing therefrom under 35 U.S.C. §119, the contents of which in its entirety are herein incorporated by reference.

BACKGROUND

1. Field

The present disclosure relates to a superconducting cable terminal connection device, and more particularly, to a superconducting cable terminal connection device in which a connection portion of a vertical conductor and a horizontal conductor has a mechanically stable support structure.

2. Description of the Related Art

A superconducting cable terminal connection device is a device that connects a superconducting cable and a conducting cable to each other at a terminal point of a superconducting cable system. That is, the superconducting cable terminal connection device is a connection device for connecting the superconducting cable that transmits power at a very low temperature to an overhead power transmission line that is at room temperature or to power equipment such as a breaker.

The superconducting cable terminal connection device has a structure in which an electric field relaxation shield is disposed inside double metal insulation housings, and the superconducting cable and the conducting cable are connected inside the electric field relaxation shield. Specifically, in the structure, a horizontal conductor extending from the superconducting cable is introduced to the inside of the electric field relaxation shield, and a vertical conductor extending from a bus bar of the overhead power transmission line, the power equipment, or the like is introduced so as to connect the horizontal conductor and the vertical conductor to each other.

In addition, since the inner insulation housing (coolant tank) is filled with a coolant (for example, cryogenic liquid nitrogen), the electric field relaxation shield is maintained in a state immersed into the coolant. The coolant is also filled in the electric field relaxation shield, and the inner insulation housing is covered with the outer insulation housing (a vacuum container) that maintains a vacuum insulation gap.

The superconducting cable system uses liquid nitrogen as main insulating material and is driven at a temperature of 65K to 77K. Therefore, heat shrinkage occurs in the superconducting cable due to cryogenic cooling and thus mechanical stress is exerted thereon.

In order to cope with the heat shrinkage, there is a demand for a structure capable of allowing heat shrinkage in the terminal connection device of the superconducting system.

With the demand for the structure, various methods have been considered. However, in the existing methods, even though heat expansion and contraction in the horizontal direction are allowed, it is difficult to implement a structure combined with a structural member that supports the weight of the horizontal conductor. Therefore, the structure becomes useless or becomes structurally complex.

In addition, the existing methods need an additional structure for spacing the electric field relaxation shield to be fixed at the center portion of the inside of the insulation housing.

In addition, in the existing methods, a structural member that supports the electric field relaxation shield and a structural member that supports the horizontal conductor are separate members and supported separately, so that the structure becomes more complex and it is very difficult to manufacture the structure.

SUMMARY

The present disclosure is directed to providing a superconducting cable terminal connection device which provides a structure in which a connection portion of a vertical conductor and a horizontal conductor supports the weight of the horizontal conductor while smoothly allowing heat expansion and contraction of the horizontal conductor in a lengthwise direction, thereby being mechanically stable and stably absorbing the heat expansion and contraction.

The present disclosure is also directed to providing a superconducting cable terminal connection device which is structurally simple by unifying a structural member that supports a horizontal conductor and a structural member that supports an electric field relaxation shield.

In one aspect, the superconducting cable terminal connection device has a structure in which the weight of a horizontal conductor is supported by a vertical conductor and the horizontal conductor is joined to the vertical conductor so as to be slidable.

Specifically, there is provided a superconducting cable terminal connection device which connects a terminal of a superconducting cable for power transmission to an external power system, including: an electric field relaxation shield disposed inside an insulation housing; a horizontal conductor fixed to an end portion of a core of the superconducting cable drawn into the electric field relaxation shield; an insulator which coats an outer periphery of the horizontal conductor; a vertical conductor which is drawn into the electric field relaxation shield and has a through-hole through which the horizontal conductor and the insulator pass so as to be slidable in a lengthwise direction; and a flexible electrical conduction member which electrically connects an end portion of the horizontal conductor to the vertical conductor, wherein an outer peripheral portion of a lower portion of the insulator of the horizontal conductor is put on a bottom of an inner periphery of the through-hole so as to be slidable, so that a weight of the horizontal conductor is supported and sliding movement of the horizontal conductor in the lengthwise direction is allowed by the through-hole of the vertical conductor.

A lower end portion of the vertical conductor may be provided with a flange, and a lower portion of the electric field relaxation shield may be fastened to the flange, so that the vertical conductor supports the electric field relaxation shield.

A bottom portion of the electric field relaxation shield may be provided with a hole, a bracket may be inserted through the hole to be installed, and the bracket and the flange of the vertical conductor may be fixed to each other by a fastening piece.

A heat shrinkage rate of the insulator may be smaller than that of the horizontal conductor.

The flexible electrical conduction member may be made of a braided wire or a flexible printed circuit board.

The insulator may be made of Teflon or MC nylon.

A minimum protrusion length ($x_{min}$) of the end portion of the horizontal conductor protruding from the vertical conductor may be superconducting cable entire length×superconducting cable heat shrinkage rate/100.

A minimum length of the flexible electrical conduction member may be $\sqrt{x^2+y^2}$, and a maximum length thereof may be a+(a+x)+y.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION

Figure 1:
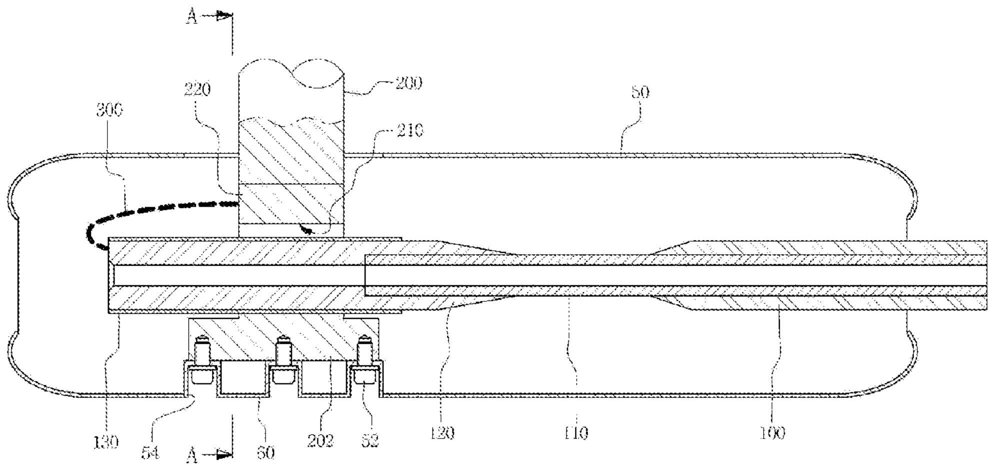
FIG. 1 is a cross-sectional view showing a superconducting cable terminal connection device according to an embodiment.

Exemplary embodiments now will be described more fully hereinafter with reference to the accompanying drawings, in which exemplary embodiments are shown. The present disclosure may, however, be embodied in many different forms and should not be construed as limited to the exemplary embodiments set forth therein. Rather, these exemplary embodiments are provided so that the present disclosure will be thorough and complete, and will fully convey the scope of the present disclosure to those skilled in the art. In the description, details of well-known features and techniques may be omitted to avoid unnecessarily obscuring the presented embodiments.

The terminology used herein is for the purpose of describing particular embodiments only and is not intended to be limiting of the present disclosure. As used herein, the singular forms “a”, “an” and “the” are intended to include the plural forms as well, unless the context clearly indicates otherwise. Furthermore, the use of the terms a, an, etc. does not denote a limitation of quantity, but rather denotes the presence of at least one of the referenced item. The use of the terms “first”, “second”, and the like does not imply any particular order, but they are included to identify individual elements. Moreover, the use of the terms first, second, etc. does not denote any order or importance, but rather the terms first, second, etc. are used to distinguish one element from another. It will be further understood that the terms “comprises” and/or “comprising”, or “includes” and/or “including” when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals denote like elements. The shape, size and regions, and the like, of the drawing may be exaggerated for clarity.

Figure 2:
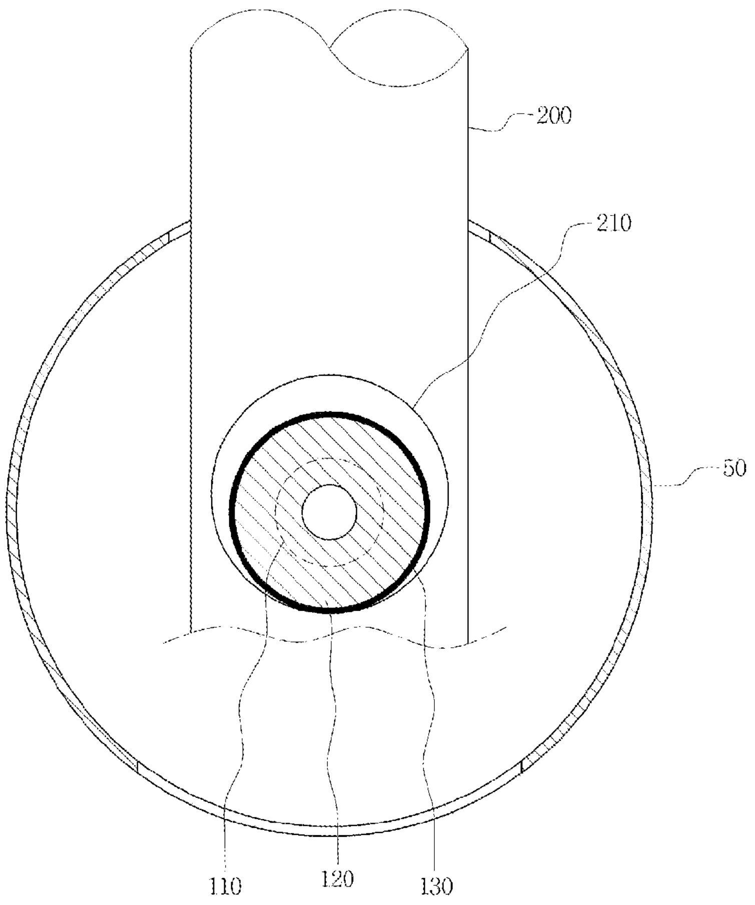
FIG. 2 is a cross-sectional view taken along the line A-A of FIG. 1.

FIGS. 1 and 2 illustrate a superconducting cable terminal connection device according to an embodiment.

Referring to FIGS. 1 and 2, in the superconducting cable terminal connection device according to the embodiment, a terminal of a superconducting cable 100 for power transmission and an end portion of a vertical conductor 200 that is drawn out to an external power system are drawn into an electric field relaxation shield 50. The edges of the electric field relaxation shield 50 are rounded so as to be formed into a shape that relaxes electric field concentration.

Although not shown in the figures, the electric field relaxation shield 50 is disposed at the center portion inside an insulation housing (coolant tank) and the insulation housing is filled with a coolant.

The superconducting cable 100 drawn into the electric field relaxation shield 50 has a core 110 as an inner conductor exposed by removing the outer coating, and a horizontal conductor 120 is fixed to an end portion of the core 110 by pressing or the like.

The outer periphery of the horizontal conductor 120 is coated with an insulator 130. The insulator 130 may be produced into a pipe shape separately from the horizontal conductor 120 and be fitted to the outer periphery of the horizontal conductor 120 so as to be joined thereto. In addition, the insulator 130 may be laminated on the outer periphery of the horizontal conductor 120 by injection molding, coating, or the like.

In the vertical conductor 200, a through-hole 210 that penetrates the center portion drawn into the electric field relaxation shield 50 in the horizontal direction is formed. The horizontal conductor 120 and the insulator 130 pass through the through-hole 210 with a spare gap in the thickness direction so as to be slidable in the lengthwise direction.

That is, the outer peripheral portion of the lower portion of the insulator 130 of the horizontal conductor 120 is put on the bottom of the inner periphery of the through-hole 210 of the vertical conductor 200 so as to be slidable. As such, the through-hole 210 is formed in the vertical conductor 200 and the horizontal conductor 120 is inserted into the through-hole 210 so as to be slidable. Therefore, the vertical conductor 200 serves as a structural member that supports the weight of the horizontal conductor 120 and has a function of allowing the sliding movement of the horizontal conductor 120 in the lengthwise direction due to heat expansion and contraction.

The end portion of the horizontal conductor 120 and the vertical conductor 200 are connected to each other with a flexible electrical conduction member 300 which is freely bendable, so as to freely allow a displacement between the horizontal conductor 120 and the vertical conductor 200.

The flexible electrical conduction member 300 may be made of a braided wire, a flexible printed circuit board (FPCB), or the like. The braided wire is flexibly bent by the movement of the horizontal conductor 120 due to heat expansion and contraction and thus may be used as an electrical conduction member for allowing heat expansion and contraction of the horizontal conductor 120.

In addition, the lower end portion of the vertical conductor 200 is provided with a flange 202 and the lower portion of the electric field relaxation shield 50 is fastened to the flange 202, so that the vertical conductor 200 also has a function of supporting the electric field relaxation shield 50.

That is, since the electric field relaxation shield 50 is suspended from and fixed to the vertical conductor 200, an additional support device or fixing device for fixing the electric field relaxation shield 50 to the center of the insulation housing is unnecessary.

In this embodiment, in order to easily fix the electric field relaxation shield 50, a hole 54 is formed at the bottom portion of the electric field relaxation shield 50, and a bracket 60 is inserted through the hole 54 and is fixed to the hole 54 by welding or the like. Then, the bracket 60 and the flange 202 of the vertical conductor 200 are fastened to each other by a fastening piece 52.

Meanwhile, although the insulator 130 has a function of insulation, since the insulator 130 comes in sliding contact with the vertical conductor 200 during heat expansion and contraction of the horizontal conductor 120, the insulator 130 may be configured of a material having good insulation stability and a low coefficient of friction.

In addition, the insulator 130 having a heat shrinkage rate lower than that of the horizontal conductor 120 may be used. When the shrinkage rate of the insulator 130 is higher than the heat shrinkage rate of the horizontal conductor 120, the insulator may be broken, and accordingly insulation may be broken or frictional force may be increased, resulting in interference in the displacement of the horizontal conductor 120.

In consideration of such matters, Teflon (PTEE) or Mono Casting (MC) nylon is suitable for the insulator 130. In addition, in order to facilitate sliding without lubricant, the insulator 130 may be processed to have a surface roughness of equal to or lower than 100 micron rms.

In the superconducting cable terminal connection device according to the embodiment configured as described above, due to the structure in which the through-hole 210 is formed in the vertical conductor 200 in the horizontal direction and the horizontal conductor 120 is inserted into the through-hole 210 so as to be slidable in the lengthwise direction, the vertical conductor 200 has the function of supporting the weight of the horizontal conductor 120 and has the function of freely allowing the displacement of the horizontal conductor 120 in the lengthwise direction.

Therefore, an additional structural member for supporting the weight of the horizontal conductor 120 and the superconducting cable 100 does not need to be installed, so that the structure becomes simple, and mechanical stress exerted on the superconducting cable 100 and the horizontal conductor 120 during heat expansion and contraction or mechanical stress exerted on the support structural member is not generated.

In addition, by coating the outer periphery of the horizontal conductor 120 with the insulator 130, the problem of insulation between the horizontal conductor 120 and the vertical conductor 200 is simply solved. Furthermore, as the insulator 130 is configured of a material such as Teflon or MC nylon, insulation stability can be increased and frictional resistance between the horizontal conductor 120 and the vertical conductor 200 can be minimized.

In addition, since the electric field relaxation shield 50 is fixed to the vertical conductor 200, the functions of allowing the displacement of the horizontal conductor 120 due to heat expansion and contraction, supporting the horizontal conductor 120, and supporting the electric field relaxation shield 50 are unified by the vertical conductor 200. Therefore, the structure becomes simpler and an installation operation in the field can be more simply performed.

Figure 3:
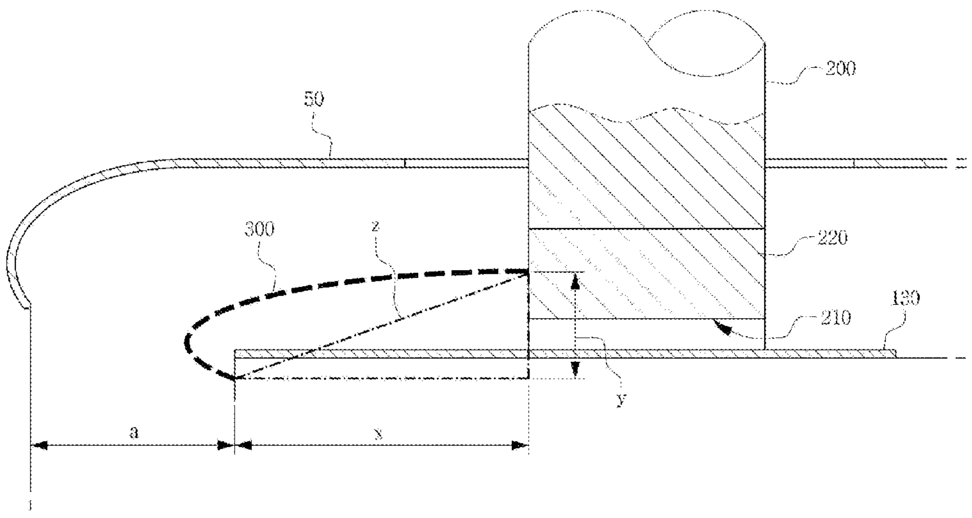
FIG. 3 is a diagram for explaining a desirable length of a braided wire in the terminal connection device according to the embodiment.

FIG. 3 is a diagram for explaining a desirable length of the flexible electrical conduction member 300 in the terminal connection device according to the embodiment.

When the superconducting cable is cooled to −195 degrees (liquid nitrogen temperature) from 25 degrees, the superconducting cable shrinks and the horizontal conductor 120 is moved to the right in the figure by a heat shrinkage rate. For example, if the length of the superconducting cable is 100 m and the heat shrinkage rate thereof is 0.2%, the horizontal conductor 120 is moved to the right by 100 m×0.2/100=0.2 m In this case, when a protrusion length x of the end portion of the horizontal conductor 120 protruding from the vertical conductor 200 is not equal to or greater than 0.2 m, if the horizontal conductor 120 is moved to the right in the figure, there is a concern of the horizontal conductor 120 falling out of the through-hole 210 of the vertical conductor 200. Therefore, the minimum protrusion length xmin of the end portion of the horizontal conductor 120 protruding from the vertical conductor 200 may be the entire length of the superconducting cable×the heat shrinkage rate of the superconducting cable/100.

In addition, the flexible electrical conduction member 300 may have a length so as to maintain the minimum length and not to come in contact with the inner wall of the electric field relaxation shield 50 in the axial direction or not to protrude outward.

For this, the minimum length of the flexible electrical conduction member 300 may be $\sqrt{x^2+y^2}$, and the maximum length thereof may be a+(a+x)+y. Here, a is the distance from the connection portion of the horizontal conductor 120 and the flexible electrical conduction member 300 to the inner wall of the electric field relaxation shield 50 in the axial direction, x is the protrusion length of the horizontal conductor 120 from the vertical conductor 200, and y is the height of between the connection end portions of the both sides of the flexible electrical conduction member 300. If the actual length of the flexible electrical conduction member 300 becomes greater than the maximum length of the above expression, the flexible electrical conduction member 300 protrudes outward from the electric field relaxation shield 50, and edges are generated in the site. Therefore, there is concern that an electric field is concentrated thereon and insulation is broken.

In the superconducting cable terminal connection device according to the present disclosure, due to the structure in which the through-hole is formed in the vertical conductor in the horizontal direction and the horizontal conductor is inserted into the through-hole so as to be slidable in the lengthwise direction, the vertical conductor has a function of supporting the weight of the horizontal conductor and has a function of freely allowing the displacement of the horizontal conductor in the lengthwise direction.

Therefore, an additional structural member for supporting the superconducting cable and the weight of the horizontal conductor does not need to be installed, so that the structure becomes very simple. In addition, mechanical stress exerted on the superconducting cable and the horizontal conductor during heat expansion and contraction or mechanical stress exerted on the support structural members is not generated or minimized by the free sliding movement of the horizontal conductor.

In addition, by coating the outer periphery of the horizontal conductor with the insulator, a problem of insulation between the horizontal conductor and the vertical conductor is simply solved. In addition, as the insulator is configured of a material such as Teflon, insulation stability between the horizontal conductor and the vertical conductor can be increased and frictional resistance therebetween can be minimized.

In addition, since the electric field relaxation shield is fixed to the vertical conductor, an additional support structural member for supporting the electric field relaxation shield in the insulation housing is unnecessary, and thus the structure is simple.

While the exemplary embodiments have been shown and described, it will be understood by those skilled in the art that various changes in form and details may be made thereto without departing from the spirit and scope of the present disclosure as defined by the appended claims.

In addition, many modifications can be made to adapt a particular situation or material to the teachings of the present disclosure without departing from the essential scope thereof.

Therefore, it is intended that the present disclosure not be limited to the particular exemplary embodiments disclosed as the best mode contemplated for carrying out the present disclosure, but that the present disclosure will include all embodiments falling within the scope of the appended claims.

What is claimed is:

1. A superconducting cable terminal connection device which connects a terminal of a superconducting cable for power transmission to an external power system, comprising:
- an electric field relaxation shield disposed inside an insulation housing;
- a horizontal conductor fixed to an end portion of a core of the superconducting cable drawn into the electric field relaxation shield;
- an insulator which coats an outer periphery of the horizontal conductor;
- a vertical conductor which is drawn into the electric field relaxation shield and has a through-hole through which the horizontal conductor and the insulator pass so as to be slidable in a lengthwise direction; and
- a flexible electrical conduction member which electrically connects an end portion of the horizontal conductor to the vertical conductor,
- wherein an outer peripheral portion of a lower portion of the insulator of the horizontal conductor is put on a bottom of an inner periphery of the through-hole so as to be slidable, so that a weight of the horizontal conductor is supported and sliding movement of the horizontal conductor in the lengthwise direction is allowed by the through-hole of the vertical conductor.

2. The superconducting cable terminal connection device according to claim 1, wherein a lower end portion of the vertical conductor is provided with a flange, and a lower portion of the electric field relaxation shield is fastened to the flange, so that the vertical conductor supports the electric field relaxation shield.

3. The superconducting cable terminal connection device according to claim 2, wherein a bottom portion of the electric field relaxation shield is provided with a hole, a bracket is inserted through the hole to be installed, and the bracket and the flange of the vertical conductor are fixed to each other by a fastening piece.

4. The superconducting cable terminal connection device according to claim 1, wherein a heat shrinkage rate of the insulator is smaller than that of the horizontal conductor.

5. The superconducting cable terminal connection device according to claim 4, wherein the insulator is made of Teflon or MC nylon.

6. The superconducting cable terminal connection device according to claim 1, wherein a minimum protrusion length ($x_{min}$) of the end portion of the horizontal conductor protruding from the vertical conductor is superconducting cable entire length×superconducting cable heat shrinkage rate/100.

7. A superconducting cable terminal connection device,
- wherein a core of a superconducting cable is drawn into an electric field relaxation shield for connecting a terminal of the superconducting cable for power transmission to an external power system,
- a horizontal conductor is fixed to an end portion of the core,
- a horizontal conductor is joined to a vertical conductor so as to be slidable in an axial direction,
- an end portion of the horizontal conductor and the vertical conductor are connected by a flexible electrical conduction member, and
- a minimum length of the flexible electrical conduction member is $\sqrt{x^2+y^2}$, and a maximum length thereof is $a+(a+x)+y$, where a is a distance from a connection portion of the horizontal conductor and the flexible electrical conduction member to an inner wall of the electric field relaxation shield in the axial direction, x is a protrusion length of the horizontal conductor from the vertical conductor, and y is a height between connection end portions of both sides of the flexible electrical conduction member.

8. The superconducting cable terminal connection device according to claim 7, wherein the flexible electrical conduction member is made of a braided wire or a flexible printed circuit board.

* * * * *